US012604451B2

(12) United States Patent
Sakurayama

(10) Patent No.: US 12,604,451 B2
(45) **Date of Patent: \*Apr. 14, 2026**

(54) MOUNTING SYSTEM AND MOUNTING METHOD

(71) Applicant: FUJI CORPORATION, Chiryu (JP)

(72) Inventor: Takeshi Sakurayama, Nisshin (JP)

(73) Assignee: FUJI CORPORATION, Chiryu (JP)

( * ) Notice: Subject to any disclaimer, the term of this patent is extended or adjusted under 35 U.S.C. 154(b) by 420 days.

This patent is subject to a terminal disclaimer.

(21) Appl. No.: 18/251,607

(22) PCT Filed: Dec. 8, 2020

(86) PCT No.: PCT/JP2020/045569
§ 371 (c)(1),
(2) Date: May 3, 2023

(87) PCT Pub. No.: WO2022/123642
PCT Pub. Date: Jun. 16, 2022

(65) Prior Publication Data
US 2024/0015944 A1 Jan. 11, 2024

(51) Int. Cl.
*H05K 13/08* (2006.01)
*H05K 13/04* (2006.01)

(52) U.S. Cl.
CPC ..... *H05K 13/0882* (2018.08); *H05K 13/0419* (2018.08)

(58) Field of Classification Search
CPC ...................... H05K 13/0882; H05K 13/0419
USPC ....................................................... 700/117
See application file for complete search history.

(56) References Cited

U.S. PATENT DOCUMENTS

| | | | | | |
|---|---|---|---|---|---|
| 6,971,161 | B1 * | 12/2005 | Maenishi | ............... | H05K 13/08 |
| | | | | | 700/121 |
| 9,354,628 | B2 * | 5/2016 | Otsuka | ................. | G05B 19/418 |
| 10,779,451 | B2 * | 9/2020 | Knox | ................. | H05K 13/0408 |
| 2009/0300908 | A1 * | 12/2009 | Endo | ...................... | H05K 13/04 |
| | | | | | 29/739 |

(Continued)

FOREIGN PATENT DOCUMENTS

| | | | | | |
|---|---|---|---|---|---|
| EP | 3258763 | B1 * | 3/2021 | ......... | H05K 13/0469 |
| JP | 2005-183412 | A | 7/2005 | | |

(Continued)

OTHER PUBLICATIONS

International Search Report issued Feb. 16, 2021 in PCT/JP2020/045569 filed on Dec. 8, 2020 citing documents 15-16 therein, 2 pages.

*Primary Examiner* — Md Azad
(74) *Attorney, Agent, or Firm* — Oblon, McClelland, Maier & Neustadt, L.L.P.

(57) ABSTRACT

A mounting system of the present disclosure includes a component supply section configured to supply a component from a holding member on which multiple components are held, a mounting section configured to mount a pickup member configured to pick up the component from the component supply section, a measurement section configured to measure an upper surface height of the component held on the holding member, and a lifting and lowering mechanism configured to lift and lower the pickup member by a push-in amount larger than the upper surface height of the component measured by the measurement section.

6 Claims, 6 Drawing Sheets

(56)        References Cited

U.S. PATENT DOCUMENTS

2018/0054931 A1*   2/2018   Sugimoto ......... H05K 13/0857

FOREIGN PATENT DOCUMENTS

| JP | 2013-162103 A | 8/2013 |
| JP | 2014-96509 A | 5/2014 |
| JP | 2020-65010 A | 4/2020 |

* cited by examiner

Fig. 3

| DISPOSITION ORDER | ID OF COMPONENT | COMPONENT TYPE | DISPOSITION POSITION |
|---|---|---|---|
| 1 | #1 | GENERAL PURPOSE | (,) |
| 2 | #1 | GENERAL PURPOSE | (,) |
| 3 | #1 | GENERAL PURPOSE | (,) |
| ⋮ | ⋮ | ⋮ | ⋮ |
| 12 | #111 | LARGE | (,) |
| ⋮ | ⋮ | ⋮ | ⋮ |

| ID OF HOLDING MEMBER | TYPE OF HOLDING MEMBER | ID OF COMPONENT | COMPO-NENT TYPE | OFFSET VALUE | | | PICKUP RATE |
|---|---|---|---|---|---|---|---|
| | | | | INITIAL VALUE | DESIGNA-TION VALUE | SET VALUE | |
| #1 | ** | #1 | GENERAL PURPOSE | ** | | | ** |
| #2 | ** | #1 | GENERAL PURPOSE | ** | | | ** |
| ⋮ | ⋮ | ⋮ | ⋮ | ⋮ | ⋮ | ⋮ | ⋮ |
| #10 | ** | #111 | LARGE | ** | | | ** |
| #11 | ** | #111 | LARGE | ** | | | ** |
| #12 | ** | #112 | LARGE | ** | ** | | ** |
| ⋮ | ⋮ | ⋮ | ⋮ | ⋮ | ⋮ | ⋮ | ⋮ |

STORAGE SECTION 33
34
35

Fig. 6
Fig. 6A
Fig. 6B
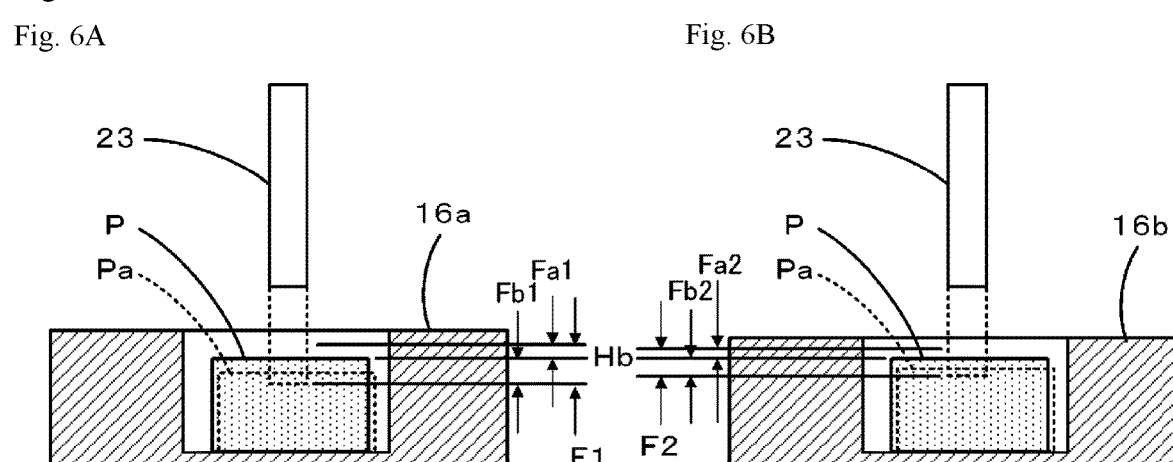
F2<F1
|Fa2|<|Fa1|
|Fb2|<|Fb1|
Fig. 7
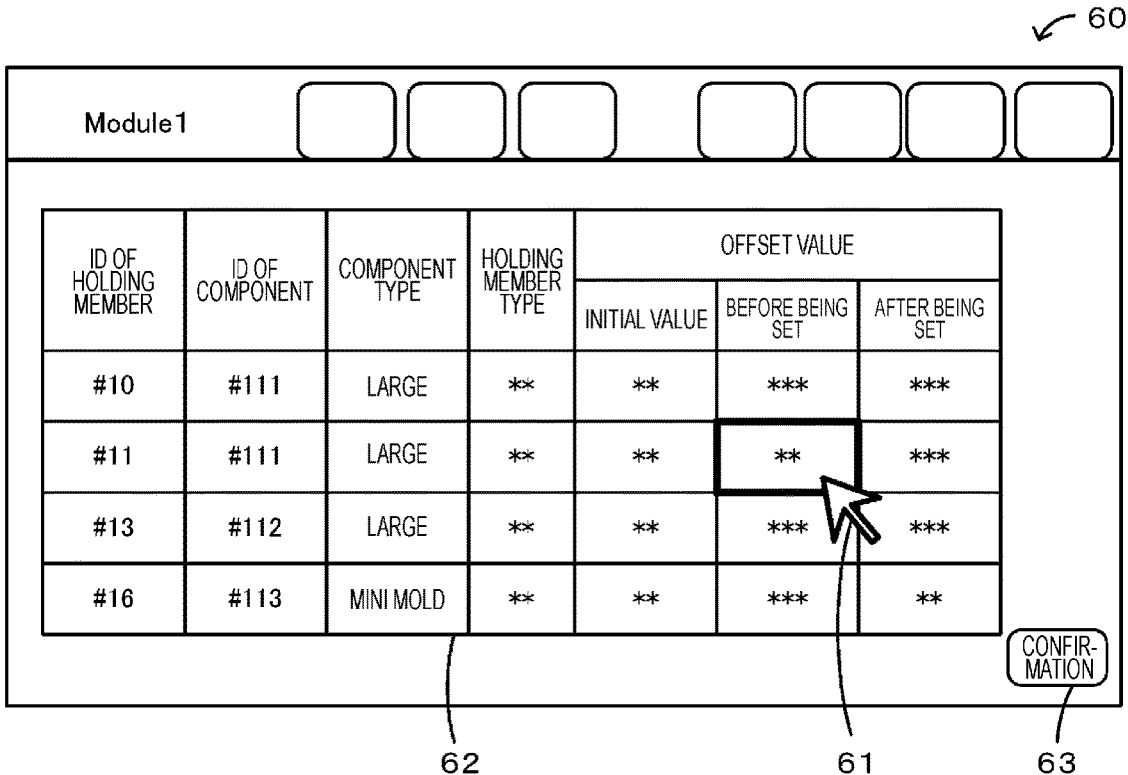

MOUNTING SYSTEM AND MOUNTING METHOD

TECHNICAL FIELD

The present description discloses a mounting system and a mounting method.

BACKGROUND ART

In the conventional art, as a mounting device, a mounting device, which specifies positional information of an electronic component on which components are held or mounted using a mounting condition including a height, specifies a variation in the position of the electronic component for each mounting condition using multiple specified positional information, and specifies a new mounting condition of the electronic component using the specified variation, has been proposed (see Patent Literature 1, for example). In the device, it is assumed that the accuracy of holding or mounting the component can be improved by changing a height of a suction nozzle or the like in accordance with the positional deviation of the component when holding and mounting the component.

PATENT LITERATURE

Patent Literature 1: JP-A-2014-96509

BRIEF SUMMARY

Technical Problem

However, in Patent Literature 1, the height of the suction nozzle is changed to increase the accuracy of holding or mounting of the component, but it is not sufficient yet, and it is demanded to perform picking up of the component with a higher accuracy.

The present disclosure has been made in view of such problems, and an object of the present disclosure to provide a mounting system and a mounting method capable of performing picking up of a component with a higher accuracy.

Solution to Problem

The present disclosure employs the following means in order to achieve the above-described object.

A mounting system of the present disclosure includes
a component supply section configured to supply a component from a holding member on which multiple components are held,
a mounting section configured to mount a pickup member configured to pick up the component from the component supply section,
a measurement section configured to measure an upper surface height of the component held on the holding member, and
a lifting and lowering mechanism configured to lift and lower the pickup member by a push-in amount larger than the upper surface height of the component measured by the measurement section.

In the mounting system, the upper surface height of the component held on the holding member is measured, and the pickup member that picks up the component from the component supply section is lifted and lowered by the push-in amount larger than the measured upper surface height of the component. In the mounting system, for example, depending on the type of the component, a dimensional accuracy of the component or a clearance of a portion of the holding member on which the components are held is relatively large, and a pickup accuracy may be influenced when the component is picked up by the pickup member. In the mounting system, since the pickup member is lifted and lowered by the push-in amount larger than the measured upper surface height of the component, the picking up of the component can be performed with a higher accuracy.

BRIEF DESCRIPTION OF DRAWINGS

FIG. 3 is an explanatory diagram showing an example of information stored in storage section 33.
FIG. 6 is an explanatory diagram of an allowable range of an offset value corresponding to holding member 16.
FIG. 7 is an explanatory diagram showing an example of offset value display screen 60.

DESCRIPTION OF EMBODIMENTS

Figure 1:
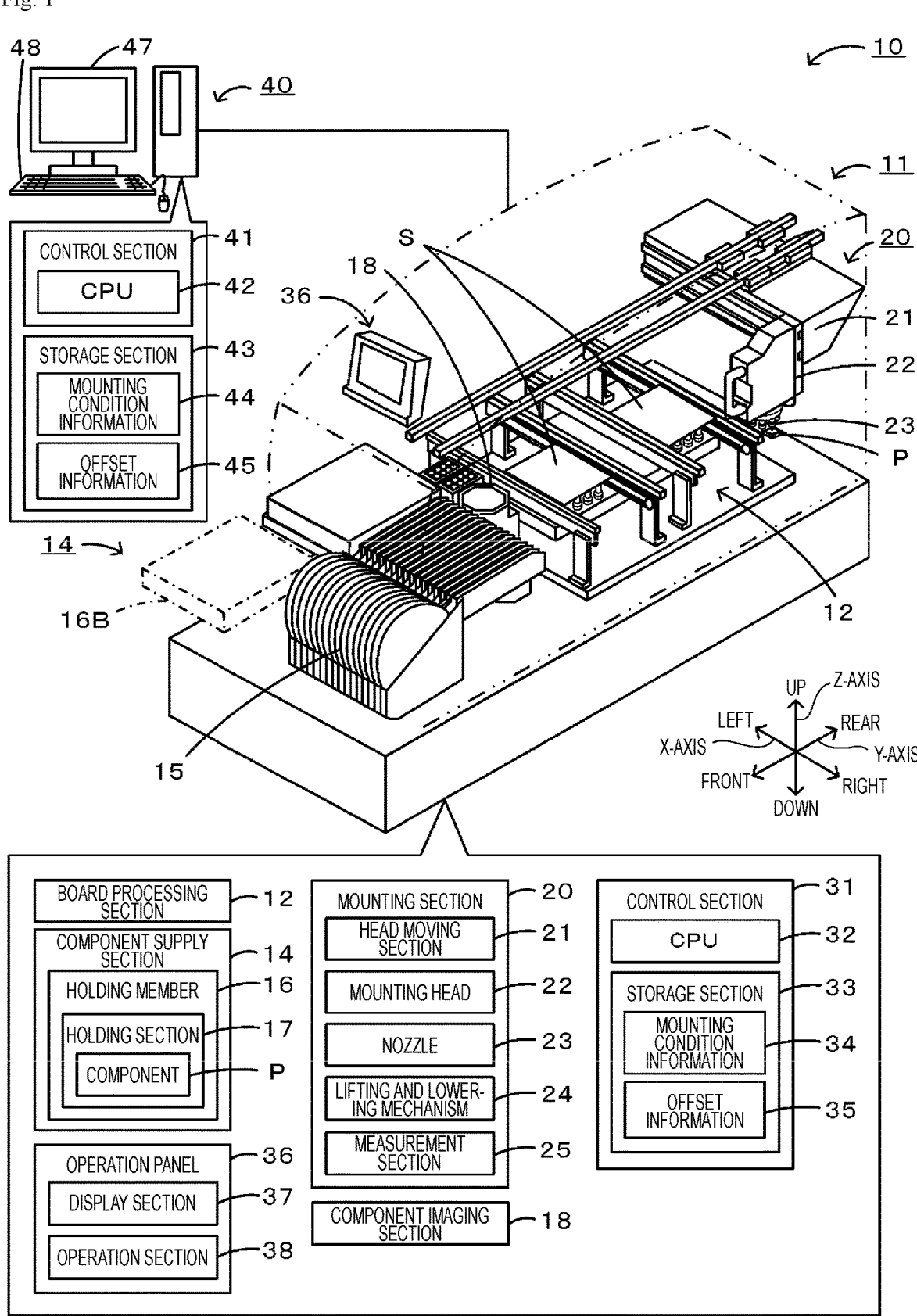
FIG. 1 is a schematic explanatory diagram showing an example of mounting system 10.
Figure 2:
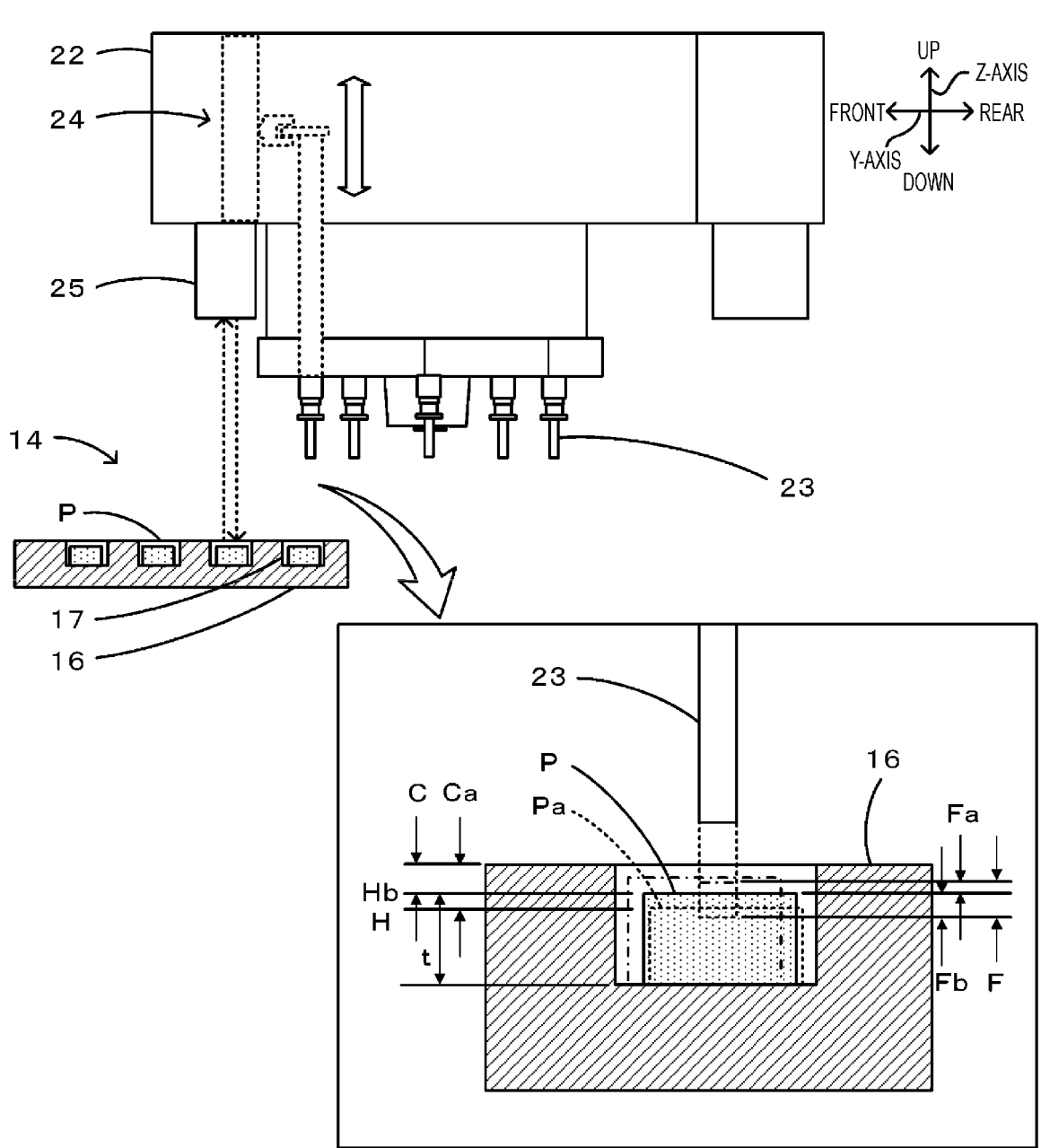
FIG. 2 is an explanatory diagram showing an example of mounting section 20 and component supply section 14.

Hereinafter, the present embodiment will be described with reference to the drawings. FIG. 1 is a schematic explanatory diagram of mounting system 10 that is an example of the present disclosure. FIG. 2 is an explanatory diagram showing an example of mounting section 20 and component supply section 14. FIG. 3 is an explanatory diagram showing an example of mounting condition information 34 and offset information 35 stored in storage section 33. Mounting system 10 is configured, for example, as a production line in which mounting devices 11 that perform a mounting process of component P on board S serving as a process target object are arranged in a conveyance direction of board S. Here, the process target object will be described as board S, but the process target object is not particularly limited as long as the process target object is a board on which component P is mounted, and may be a substrate having a three-dimensional shape. As shown in FIG. 1, mounting system 10 includes mounting device 11, management device 40, or the like. In FIG. 1, only one mounting device 11 is shown. In the present embodiment, a left-right direction (X-axis), a front-rear direction (Y-axis), and an up-down direction (Z-axis) are as shown in FIGS. 1 and 2.

As shown in FIG. 1, mounting device 11 includes board processing section 12, component supply section 14, component imaging section 18, mounting section 20, control section 31, and operation panel 36. Board processing section 12 is a unit that carries in board S, conveys board S, fixes board S at a mounting position, and carries out board S. Board processing section 12 has two pairs of conveyor belts that are provided with intervals in the front-rear direction in FIG. 1 and built in the left-right direction. Board S is conveyed by the conveyor belts.

Component supply section 14 is a unit that supplies component P to mounting section 20. Component supply section 14 includes multiple feeders 15 on which reels on which holding members 16 (tape members) holding components are wound are mounted. Holding member 16 is formed with holding sections 17 serving as an accommodation cavities at equal intervals, and component P is held by holding section 17. In addition, component supply section 14 includes a tray unit having holding member 16B (tray) on which multiple components P are arranged and placed.

Component imaging section 18 is a device that captures an image of one or more components P, which are picked up and held by mounting head 22, from below. Component imaging section 18 captures the image of component P when mounting head 22 that picks up component P passes above component imaging section 18, and outputs the captured image to control section 31. Control section 31 can detect whether component P is normally picked up, using the captured image.

Mounting section 20 is a unit that picks up component P from component supply section 14 and disposes component P on board S fixed to board processing section 12. Mounting section 20 includes head moving section 21, mounting head 22, and nozzle 23. In addition, mounting section 20 includes lifting and lowering mechanism 24 and measurement section 25. Head moving section 21 includes a slider movable in XY directions while being guided by guide rails and a motor for driving the slider. Mounting head 22 picks up one or more components P and moves in the XY direction by head moving section 21. Mounting head 22 is detachably mounted on slider. One or more nozzles 23 are detachably mounted on a lower surface of mounting head 22. Nozzle 23 is a pickup member that picks up component P using a negative pressure. The pickup member that picks up component P may be a mechanical chuck or the like that mechanically grips component P, in addition to nozzle 23.

As shown in FIG. 2, lifting and lowering mechanism 24 is a device that engages with a flange portion of a cylinder on which nozzle 23 is mounted to lift and lower nozzle 23 in the up-down direction. Lifting and lowering mechanism 24 may be a ball screw mechanism or a linear motor. Lifting and lowering mechanism 24 can finely adjust a position of a distal end of nozzle 23 in the up-down direction when nozzle 23 is lowered most. Measurement section 25 measures upper surface height H of component P held on holding member 16 of component supply section 14. As shown in FIG. 2, measurement section 25 is disposed on a lower surface side of mounting head 22. Measurement section 25 may measure a distance to an upper surface of component P, for example, by sensing reflected light obtained by irradiation with laser light.

Control section 31 is configured as a microprocessor centered on CPU 32, and includes storage section 33 that stores various data. Control section 31 outputs control signals to board processing section 12, component supply section 14, operation panel 36, and mounting section 20, and inputs signals from mounting section 20, component supply section 14, operation panel 36, or mounting section 20. Storage section 33 stores mounting condition information 34, offset information 35, or the like. Mounting condition information 34 is information including a disposition order of mounting components P on board S, identification information (ID) of component P, information on a type of the component, a disposition position (XY coordinate) on board S, and the like. Offset information 35 is information including an offset value indicating the push-in amount of nozzle 23 from reference height Hb of component P when component P is picked up from holding member 16. Offset information 35 includes, in association with holding member 16, ID of holding member 16, information on a type of holding member 16, ID of held component P, information on a type of component P, and information on the offset value as well as the pickup rate, which is a success rate when component P is picked up. In mounting device 11, in the type of component P, for example, in a square chip or a mini mold, in component P larger than a predetermined size, the dimensional accuracy or clearance C of holding section 17 of holding member 16 may be relatively large. As shown in FIG. 2, for example, component Pa has an upper surface position lower than reference height Hb and shows larger clearance Ca. Similarly, in component P, the upper surface position may be higher than reference height Hb, and thus mounting device 11 sets offset range F as an allowable range for setting the offset value between upper limit value Fa and lower limit value Fb. Offset range F can be defined as an allowable range of upper surface height H of component P for which the offset value can be set. Upper limit value Fa may be, for example, a value of 10% or 20% of thickness t of component P upward from reference height Hb. Lower limit value Fb may be, for example, a value of 20% or 30% of thickness t of component P downward from reference height Hb. Offset information 35 includes, as the offset value, any of a designation value input and designated by an operator and a set value set by control section 31 in an offset setting process. As described above, the type of the holding member is stored in offset information 35 in order to estimate the influence on upper surface height H of component P.

Operation panel 36 is a unit that exchanges information with the operator, and has display section 37 for displaying a screen and operation section 38 for the operator to operate.

Management device 40 is a computer that manages information of each device of mounting system 10. As shown in FIG. 1, management device 40 includes control section 41, storage section 43, display section 47, and input device 48. Control section 41 is configured as a microprocessor centered on CPU 42. Storage section 43 is a device, such as HDD, that stores various data, such as a processing program. Storage section 43 stores mounting condition information 44 similar to mounting condition information 34, offset information 45 similar to offset information 35, or the like. Display section 47 is a liquid crystal screen that displays various information. Input device 48 includes a keyboard, a mouse, and the like through which the operator inputs various commands.

Figure 4:
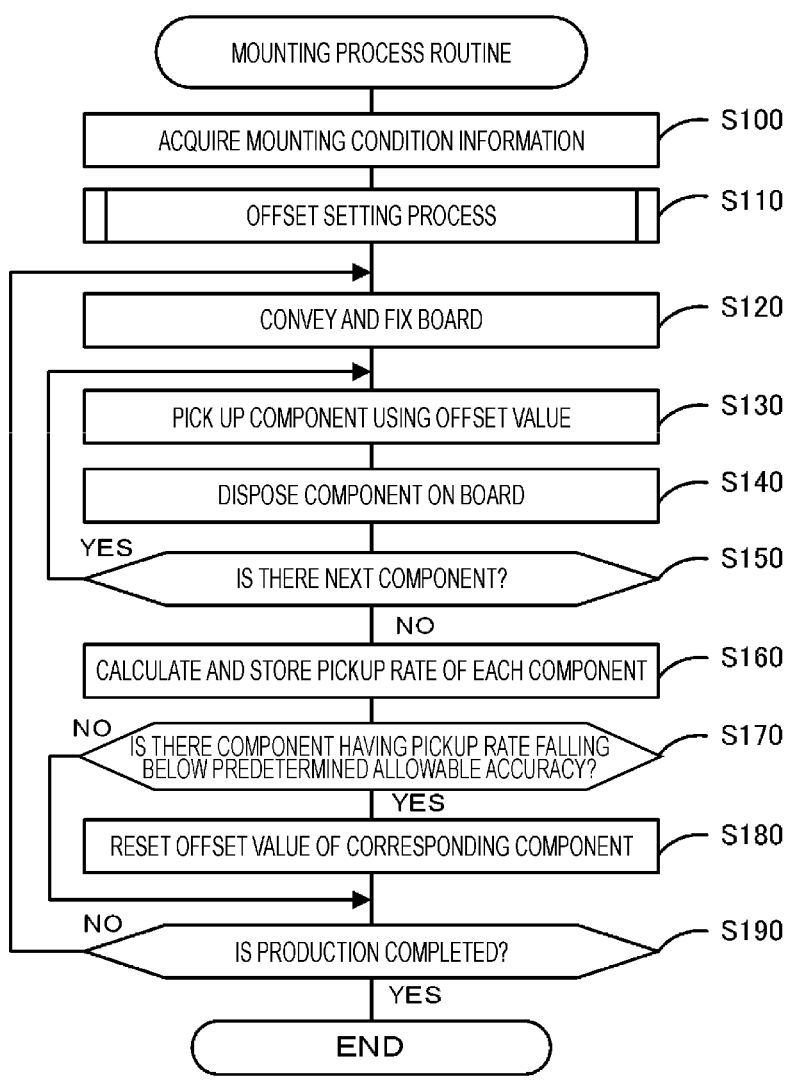
FIG. 4 is a flowchart showing an example of a mounting process routine.

Next, an operation of mounting system 10 of the present embodiment configured as described above, particularly, a process of setting the offset value and performing the mounting process will be described. FIG. 4 is a flowchart showing an example of a mounting process routine performed by CPU 32 of control section 31. The routine is stored in storage section 33 and is performed by an instruction from the operator. When the routine is performed, CPU 32 reads out and acquires mounting condition information 34 (S100), and performs the offset setting process (S110).

Figure 5:
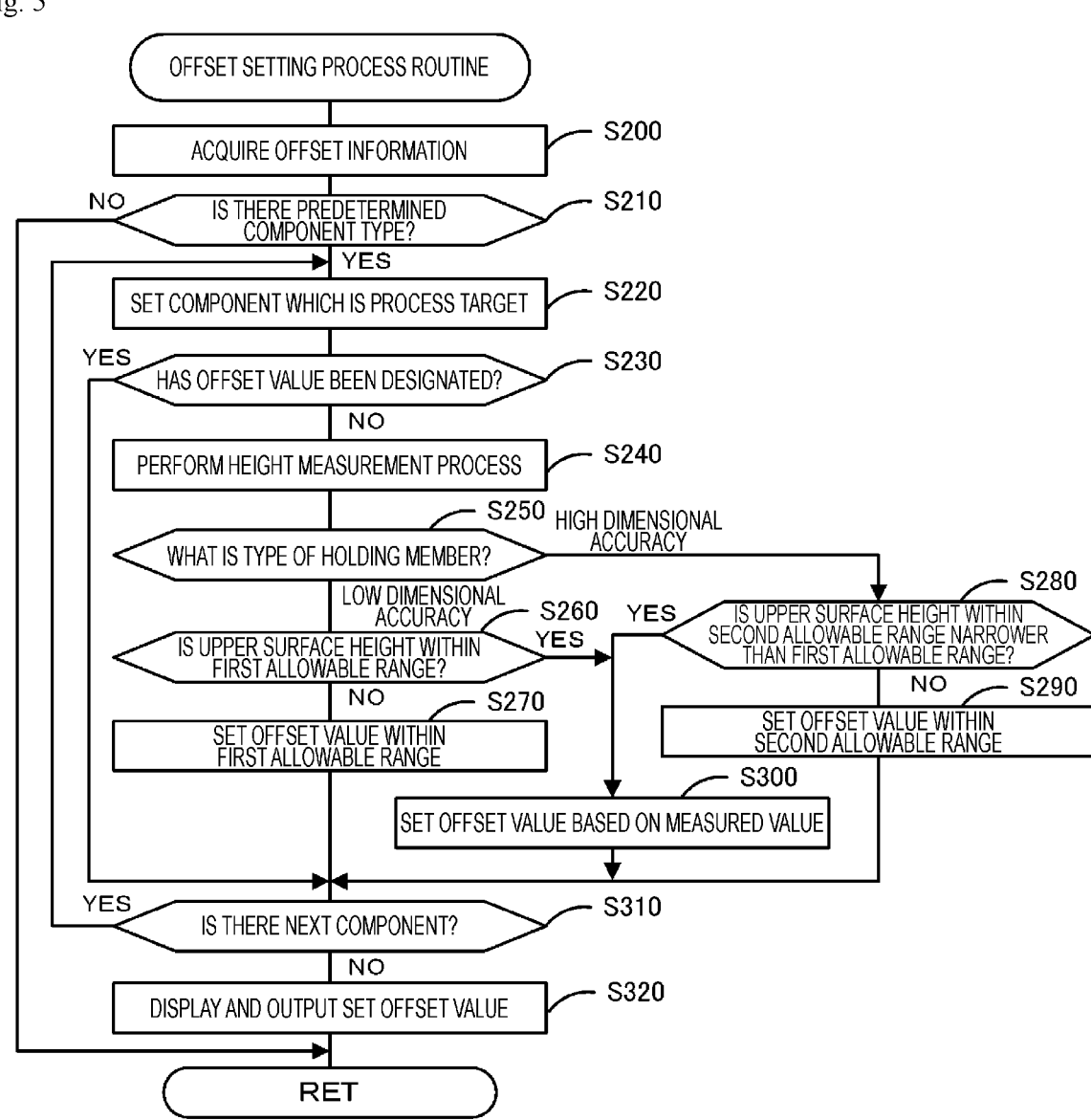
FIG. 5 is a flowchart showing an example of an offset setting process routine.

FIG. 5 is a flowchart showing an example of an offset setting process routine performed by CPU 32 of control section 31. The routine is stored in storage section 33 and performed in S110 of the mounting process routine. When the routine is performed, CPU 32 reads out and acquires offset information 35 from storage section 33 (S200), and determines whether there is a component of a predetermined component type among components P on which the mounting process is performed (S210). The predetermined component type may be determined empirically by, for example, a type that influences the pickup accuracy when component P is picked up by a pickup member, such as nozzle 23. The predetermined component type may be a component equal to or larger than a predetermined size. The "predetermined size" may be determined empirically, for example, such a size that clearance C of holding member 16 or the component itself is relatively larger than other components P to influence the picking up of component P by the pickup member, such as nozzle 23. As such a component type, a large square chip component or mini mold component which is manufactured to have a relatively rough size may be used. The component type may be determined by, for example, empirically obtaining a component type having a low pickup rate, which has the pickup rate that can be normally picked up is equal to or smaller than a predetermined threshold value when the component type is picked up by mounting section 20. That is, the predetermined component type may be a component type for which the offset value needs to be appropriately adjusted. When there is no component P of the predetermined component type among components P on which the mounting process is performed, CPU 32 terminates the routine as it is, and performs the processes in and after S120 of the mounting process routine.

On the other hand, when it is determined in S210 that there is component P of the predetermined component type among components P on which the mounting process is performed, CPU 32 extracts corresponding component P, and sets component P which is a target for the process of setting the offset value from extracted components P (S220). Next, CPU 32 determines whether the offset value has been designated for set component P based on the stored content of offset information 35 (S230). When the offset value has been designated, CPU 32 omits the offset setting process and performs the processes in and after S310. The operator may designate the offset value when there is component P having a low pickup rate empirically. In this case, CPU 32 gives priority to the designated offset value.

On the other hand, when the offset value is not designated in S230, CPU 32 performs a height measurement process of component P (S240). In the process, CPU 32 moves measurement section 25 above component P, and causes measurement section 25 to measure the distance to the upper surface of component P (see FIG. 2). Using the measurement result, CPU 32 can obtain upper surface height H of component P, and can obtain a difference value from reference height Hb. Next, CPU 32 checks whether the dimensional accuracy of the type of holding member 16 in which component P of which the height is measured is held is low or high based on offset information 35 (S250). Examples of the type of holding member 16 having high dimensional accuracy include a paper member. Examples of the type of holding member 16 having a low dimensional accuracy include an embossed resin member.

When component P is held on holding member 16a having low dimensional accuracy, CPU 32 sets first offset range F1, which is a first allowable range corresponding to component P, and determines whether measured upper surface height H is within the first allowable range (S260). FIG. 6 is an explanatory diagram of an allowable range of the offset value corresponding to holding member 16, a portion (A) in FIG. 6 is an explanatory diagram of holding member 16a having low dimensional accuracy, and a portion (B) in FIG. 6 is an explanatory diagram of holding member 16b having high dimensional accuracy. First offset range F1 is set to a range between upper limit value Fa1 and lower limit value Fb1 (for example, +0.1 mm to −0.3 mm with respect to reference height Hb). When measured upper surface height H is not within the first allowable range, that is, when measured upper surface height H is outside the first allowable range, CPU 32 sets the offset value within the first allowable range in consideration of the reliability of the measured value (S270). CPU 32 sets upper limit value Fa1 to the offset value when measured upper surface height H exceeds upper limit value Fa1, and sets lower limit value Fb1 to the offset value when measured upper surface height H falls below lower limit value Fb1. As a result, CPU 32 can set the offset value within a common sense range. On the other hand, when upper surface height H measured in S260 is within the first allowable range, CPU 32 sets the offset value based on the measured value (S300). CPU 32 sets the offset value such that the distal end of nozzle 23 is located at a position obtained by adding a predetermined margin to measured upper surface height H.

On the other hand, when component P is held on holding member 16b having high dimensional accuracy in S250, CPU 32 sets second offset range F2, which is a second allowable range corresponding to component P, and determines whether measured upper surface height H is within the second allowable range (S280). Second offset range F2 is set to a range between upper limit value Fa2 and lower limit value Fb2. In addition, second offset range F2 is set to a narrower range than first offset range F1 (for example, +0.1 mm to −0.2 mm with respect to reference height Hb). The absolute value of upper limit value Fa2 is equal to or smaller than the absolute value of upper limit value Fa1, and the absolute value of lower limit value Fb2 is set to be smaller than the absolute value of lower limit value Fb1. Since a deviation width of the clearance is reduced in accordance with the height of component P held on holding member 16b having high dimensional accuracy, a smaller offset range can be set. When measured upper surface height H is not within the second allowable range, that is, when measured upper surface height H is outside the second allowable range, CPU 32 sets the offset value within the second allowable range in consideration of the reliability of the measured value (S290). For example, CPU 32 sets upper limit value Fa2 to the offset value when measured upper surface height H exceeds upper limit value Fa2, and sets lower limit value Fb2 to the offset value when measured upper surface height H falls below lower limit value Fb2. As a result, CPU 32 can set the offset value within a common sense range. On the other hand, when upper surface height H measured in S280 is within the second allowable range, CPU 32 sets the offset value based on the measured value (S300). CPU 32 sets the offset value such that the distal end of nozzle 23 is located at a position obtained by adding a predetermined margin to measured upper surface height H. CPU 32 can set the offset value to a value having the push-in amount larger than upper surface height H of component P measured by the measurement section, for example, any value between 0.1 mm to 0.3 mm, or 0.1 mm un to 0.2 mm.

After S270, S290, and S300, CPU 32 determines whether there is component P which is a next process target (S310), and when there is component P which is the next process target, performs the processes in and after S220. That is, CPU 32 sets component P of a next predetermined component type, measures the height of the upper surface of component P, and repeatedly performs the process of setting the offset value when the offset value has not been designated. On the other hand, when there is no component which is the next process target in S310, CPU 32 displays and outputs the set offset value (S320), and terminates the routine.

FIG. 7 is an explanatory diagram showing an example of offset value display screen 60 displayed on display section 37 of operation panel 36. Offset value display screen 60 includes cursor 61, offset value display field 62, and return key 63. Cursor 61 is used when selecting a field which is a correction target or the like. Offset value display field 62 displays the offset value included in offset information 35. Offset value display field 62 includes ID of holding member 16 for which the offset value is set this time, ID of held component P, the component type, the type of holding member 16, the offset values before and after being set, and the like. Confirmation key 63 is a key to be pressed when closing the screen after confirming the set value. The operator can confirm the changed offset value on offset value display screen 60. Offset value display screen 60 may only need to be displayed and output on any device of mounting system 10, or may be displayed on display section 47 of management device 40 in addition to display section 37.

When the offset setting process is terminated in S110 of the mounting process routine, CPU 32 conveys and fixes board S (S120), and causes nozzle 23 to pick up component P based on the disposition order of mounting condition information 34 using the offset value (S130). CPU 32 uses the offset value corresponding to component P to lower and lift nozzle 23 to a position at which the push-in amount (for example, 0.1 mm to 0.3 mm, 0.1 mm to 0.2 mm, or the like) is larger than upper surface height H of component P. In this case, since an appropriate offset value is designated or set in offset information 35, mounting section 20 can pick up component P with a higher accuracy. For example, in the conventional art, for component P having a low pickup rate, such as a large square chip or mini mold component, the operator may empirically change the offset value to increase the pickup rate. In mounting device 11, since the offset value of component P that is difficult to pick up is automatically set, it is possible to more reliably pick up component P without depending on the experience of the operator.

After S130, CPU 32 moves picked up component P to dispose component P at a predetermined position on board S (S140). In the movement of component P, CPU 32 causes component imaging section 18 to capture the image of component P picked up by mounting head 22, and detects whether component P is appropriately picked up. CPU 32 stores the detection result in storage section 33. When component P is disposed on board S, CPU 32 determines whether there is next component P to be disposed on board S based on mounting condition information 34 (S150). When there is next component P, CPU 32 performs the processes in and after S130. That is, the process of picking up component P using the offset value corresponding to component P and disposing component P on board S is repeated.

On the other hand, when there is no next component P in S150, CPU 32 determines that the disposition of component P on board S is terminated, calculates the pickup rate of each component P disposed on board S, and reflects the pickup rate in offset information 35 (S160). CPU 32 may determine a pickup failure when component P cannot be picked up, or may total cases where a deviation amount exceeds a threshold value when picking up component P as the pickup failure. The pickup rate is obtained from the number of successful picking up operations/the number of total picking up operations. Subsequently, CPU 32 determines whether there is component P having the pickup rate falling below a predetermined allowable accuracy (S170), and when there is component P having the pickup rate falling below the predetermined allowable accuracy, resets the offset value (designation value or set value) of corresponding component P to set the offset value to an initial value (S180). The predetermined allowable accuracy may be, for example, allowable accuracy empirically obtained from the yield of board S or the like (for example, 0.995 or 0.9995) in accordance with the pickup rate of other general components.

After S180 or when there is no component P having the pickup rate falling below the predetermined allowable accuracy in S170, CPU 32 determines whether the production of board S is completed (S190). When the production of board S is not completed, CPU 32 assumes that there is next board S, and performs the processes in and after S120. That is, the process of discharging board S on which the mounting has been performed, conveying and fixing next board S, and picking up and disposing component P using the offset value is repeatedly performed. On the other hand, when the production is completed in S190, CPU 32 terminates the routine.

Here, a correspondence relationship between elements of the present embodiment and elements of the present disclosure will be clarified. Component supply section 14 of the present embodiment corresponds to a component supply section of the present disclosure, mounting section 20 corresponds to a mounting section, measurement section 25 corresponds to a measurement section, lifting and lowering mechanism 24 corresponds to a lifting and lowering mechanism, control section 31 corresponds to a control section, holding member 16 corresponds to a holding member, and nozzle 23 corresponds to a pickup member. In the present embodiment, an example of the mounting method of the present disclosure is also clarified by describing the operation of control section 31.

Mounting system 10 of the present embodiment described above measures upper surface height H of component P held on holding member 16, and lifts and lowers nozzle 23 serving as the pickup member that picks up component P from component supply section 14 by the push-in amount larger than measured upper surface height H of the component. In mounting system 10, for example, depending on the type of component P, the dimensional accuracy of component P or the clearance of the portion of holding member 16 on which component P is held is relatively large, and the pickup accuracy may be influenced when component P is picked up by the pickup member. In mounting system 10, since the pickup member is lifted and lowered by the push-in amount larger than measured upper surface height H of component P, it is possible to perform the picking up of component P with a higher accuracy. In mounting system 10, when the type of component P is the predetermined component type, measurement section 25 measures upper surface height H of component P on holding member 16, and sets the offset value for lifting and lowering mechanism 24 to adjust the pickup height of mounting section 20 in accordance with measured upper surface height H of component P. In the mounting system, since upper surface height H of component P is measured to determine the offset value in a specific component type, it is possible to perform the picking up of component P with a higher accuracy. In this case, when the type of acquired component P is not the predetermined component type, control section 31 does not perform the measurement by measurement section 25 and the setting of the offset value. In control section 31, it is possible to improve the process efficiency by limiting the process.

In addition, control section 31 causes measurement section 25 to measure upper surface height H of component P when component P is equal to or larger than the predetermined size, and sets the offset value. In mounting system 10, for example, when component P is equal to or larger than the predetermined size, the dimensional accuracy of component P is rough, which may influence the picking up of component P by the pickup member, such as nozzle 23. In mounting system 10, since upper surface height H of component P is measured in component P equal to or larger than a specific size to determine the offset value, it is possible to perform the picking up of component P with a higher accuracy. In this case, when component P is smaller than the predetermined size, control section 31 does not perform the measurement by measurement section 25 and the setting of the offset value. In mounting system 10, the process efficiency can be further improved by limiting the process.

Further, control section 31 also acquires the type of holding member 16, and sets the offset value using a narrower offset range when the acquired type of holding member 16 is the predetermined type having a higher dimensional accuracy. In mounting system 10, a more appropriate offset value can be set in accordance with the type of holding member 16. In addition, when upper surface height H of component P measured by measurement section 25 is outside the predetermined allowable range, control section 31 sets the offset value within the allowable range. In mounting system 10, by setting the offset value within the allowable range, it is possible to perform a more appropriate pickup process of component P, and the pickup accuracy of component P can be further improved. Further, when the offset value is designated, control section 31 does not perform the change of the offset value. In mounting system 10, when the offset value has been designated, it is possible to perform the picking up of component P by giving priority the designation value. In addition, when the offset value is designated, control section 31 does not perform the measurement by measurement section 25. In mounting system 10, when the offset value has been designated, the process can be further simplified.

Further, control section 31 causes mounting section 20 to pick up component P from holding member 16 at the pickup height using the set offset value. In mounting system 10, it is possible to perform the picking up of component P with a higher accuracy using the set offset value. In addition, in the pickup process of component P performed using the set offset value, when the pickup rate of component P falls below a predetermined allowable pickup accuracy, control section 31 resets the set offset value. In mounting system 10, by resetting the set offset value, it is possible to further suppress degradation in the pickup accuracy of the component. In addition, since control section 31 displays the offset values before and after being set in the offset setting process routine on offset value display screen 60, the operator can confirm the offset value.

As a matter of course, the present disclosure is not limited to the above-described embodiment in any way, and the present disclosure can be embodied in various aspects without departing from the technical scope of the present disclosure.

For example, in the above-described embodiment, upper surface height H of component P is measured when component P is the predetermined component type, for example, when component P is equal to or larger than the predetermined size, or when component P is the square chip or the mini mold, but the present disclosure is not particularly limited to this. For example, control section 31 may measure upper surface height H of component P held on holding member 16 by measurement section 25 regardless of the component type, and cause the lifting and lowering mechanism 24 to lift and lower the pickup member by the push-in amount larger than upper surface height H of component P measured by measurement section 25. In mounting system since upper surface height H of component P is measured and the pickup member is lifted and lowered by the push-in amount corresponding to upper surface height H, it is possible to perform the picking up of component P with a higher accuracy. In addition, control section 31 may measure upper surface height H and set the offset value of component other than the square chip or the mini mold.

In the above-described embodiment, offset range F is changed in accordance with the dimensional accuracy of the type of the holding member, but the present disclosure is not particularly limited to this. The process may be omitted. In mounting system 10, the process can be further simplified.

In the above-described embodiment, upper limit value Fa is set to the offset value when upper surface height H of component P measured by measurement section 25 exceeds upper limit value Fa of the predetermined allowable range, and lower limit value Fb is set to the offset value when upper surface height H of component P measured by measurement section 25 falls below lower limit value Fb, but the present disclosure is not particularly limited to this, and any value within the allowable range may be set to the offset value. Also, with mounting system it is possible to perform the picking up of component P with a higher accuracy. Alternatively, in the above-described embodiment, the offset value is set within the predetermined allowable range when upper surface height H of component P measured by measurement section 25 is outside the predetermined allowable range, but the present disclosure is not particularly limited to this, and the process may be omitted. In mounting system 10, it is possible to perform the picking up of component P with a higher accuracy by reliably using the measured value by measurement section 25.

In the above-described embodiment, the offset value of offset information 35 is not changed when the offset value is designated, but the present disclosure is not particularly limited to this, and the offset value may be set by measuring upper surface height H of component P even when the offset value is set. In mounting system 10, it is possible to perform the picking up of component P with a higher accuracy by giving priority to the measured value.

In the above-described embodiment, the set offset value is reset when the pickup rate obtained by the pickup process of component P performed using the offset value falls below the predetermined allowable pickup accuracy, but the present disclosure is not particularly limited to this, and the resetting of the offset value may be omitted. In this case, control section 31 may cause display section 37 to display a warning to notify the operator that the validity of the offset value is unknown and there is component P having a low pickup rate.

In the above-described embodiment, the set offset value is displayed and output as offset value display screen 60, but the present disclosure is not particularly limited to this, and the display and output of offset value display screen 60 may be omitted. In mounting system 10, it is possible to simplify the process. In addition, although control section 31 is configured to display the offset values before and after being set, the present disclosure is not particularly limited to this, and may give a notification of ID of holding member 16 for which the offset value is set, or may notify the operator of only the offset value after the setting. In mounting system 10, the operator can recognize which offset value of holding member 16 is changed.

In the above-described embodiment, upper surface height H of component P held on holding member 16, which is the tape member mounted on feeder 15, is measured to set the offset value of component P, but the present disclosure is not particularly limited to this as long as the holding member holds component P. For example, control section 31 may measure upper surface height H of component P held on holding member 16B that is the tray of the tray unit, and set the offset value of component P. Also, in mounting system 10, it is possible to perform the picking up of component P with a higher accuracy using the offset value.

In the above-described embodiment, the description has been made in which control section 31 of mounting device 11 sets the offset value, but the present disclosure is not particularly limited to this as long as the setting is performed by the device of mounting system 10, and control section 41 of management device 40 may set the offset value, for example. In this case, control section 41 may output a measurement command of upper surface height H of component P to mounting device 11, and may acquire the measurement result or the like from mounting device 11. Also, in mounting system 10, similarly to the above-described embodiment, it is possible to perform the picking up of component P with a higher accuracy.

In the above-described embodiment, the mounting system of the present disclosure is described as mounting device 11, but the present disclosure is not particularly limited to this, and the mounting system may be the mounting method or a program causing a computer to perform the mounting method.

Here, the mounting system and the mounting method of the present disclosure may be configured as follows. For example, the mounting system of the present disclosure may further include a control section configured to cause the measurement section to measure a height of the component on the holding member when a type of the component is a predetermined component type, and set an offset value for the lifting and lowering mechanism to adjust a pickup height of the mounting section in accordance with the measured height of the component. In the mounting system, when the type of the component is the predetermined component type, the offset value for adjusting the pickup height of the mounting section is set in accordance with the height of the component on the holding member, which is measured by the measurement section. In the mounting system, since the height of the component is measured to determine the offset value in a specific component type, it is possible to perform the picking up of the component with a higher accuracy. In this case, the control section need not perform the measurement by the measurement section or the setting of the offset value when the acquired component type is not the predetermined component type. In mounting system 10, the process efficiency can be further improved by limiting the process. Here, the "predetermined component type" may be determined empirically by, for example, a type that influences the pickup accuracy when the component is picked up by the pickup member. Examples of such a component type include the square chip component or the mini mold component.

In the mounting system of the present disclosure, the control section may be configured to cause the measurement section to measure the height of the component when the component is equal to or larger than a predetermined size, and set the offset value. In the mounting system, for example, when the component is equal to or larger than the predetermined size, the dimensional accuracy of the component is rough, which may influence the picking up of the component by the pickup member. In the mounting system, since the offset value is determined by measuring the height of the component in the component equal to or larger than a specific component size, it is possible to perform the picking up of the component with a higher accuracy. In this case, the control section need not perform the measurement by the measurement section and the setting of the offset value when the component is smaller than the predetermined size. In the mounting system, it is possible to improve the process efficiency by limiting the process. Here, the "predetermined size" may be determined empirically, for example, such a size that the clearance of the holding member or the component itself is relatively larger than other components and influences the picking up of the component by the pickup member.

In the mounting system of the present disclosure, the control section may be configured to acquire a type of the holding member, and set the offset value using a narrower offset range when the acquired type of the holding member is a predetermined type having a higher dimensional accuracy. In the mounting system, a more appropriate offset value can be set in accordance with the type of the holding member. Here, examples of the type of the holding member having a higher dimensional accuracy include a paper member or the like.

In the mounting system of the present disclosure, the control section may be configured to set the offset value within a predetermined allowable range when the height of the component measured by the measurement section is outside the allowable range. In the mounting system, by setting the offset value within the allowable range, it is possible to perform a more appropriate pickup process of the component, so that the pickup accuracy of the component can be further improved.

In the mounting system of the present disclosure, the control section may be configured not to perform changing of the offset value when the offset value is designated. In the mounting system, when the offset value has been designated, it is possible to perform the picking up of the component by giving priority to the designation value. In this case, the control section need not perform the measurement by the measurement section when the offset value is designated. The offset value may be designated by the operator.

In the mounting system of the present disclosure, the control section may be configured to cause the mounting section to pick up the component from the holding member at the pickup height using the set offset value. In the mounting system, it is possible to perform the picking up of the component with a higher accuracy using the set offset value.

In the mounting system of the present disclosure, the control section may be configured to reset the set offset value when a pickup rate falls below the predetermined allowable pickup accuracy in a pickup process of the component performed using the set offset value. In the mounting system, it is possible to further suppress the degradation in the pickup accuracy of the component by resetting the set offset value.

The mounting method of the present disclosure is a mounting method used in a mounting device including a component supply section configured to supply a component from a holding member on which multiple components are held, a mounting section configured to mount a pickup member configured to pick up the component from the component supply section, and a measurement section configured to measure an upper surface height of the component held on the holding member, the mounting method including a setting step of setting an offset value for adjusting a pickup height of the mounting section in accordance with a height of the component on the holding member measured by the measurement section when a type of the component is a predetermined component type.

In the mounting method, similarly to the mounting system described above, since the height of the component is measured to determine the offset value, it is possible to perform the picking up of the component with a higher accuracy. The mounting method may employ any of the aspects of the mounting system described above, or may include a step of expressing any of the functions of the mounting system described above.

The mounting method of the present disclosure may include a display step of displaying the offset value set in the setting step and the offset value before being set in the setting step. In the mounting method, the operator can confirm the offset value.

INDUSTRIAL APPLICABILITY

The mounting system and the mounting method of the present disclosure can be used, for example, in the field of mounting electronic components.

REFERENCE SIGNS LIST

10: mounting system, 11: mounting device, 12: board processing section, 14: component supply section, 15: feeder, 16, 16a, 16b, 16B: holding member, 17: holding section, 18: component imaging section, 20: mounting section, 21: head moving section, 22: mounting head, 23: nozzle, 24: lifting and lowering mechanism, 25: measurement section, 31: control section, 32: CPU, 33: storage section, 34: mounting condition information, 35: offset information, 36: operation panel, 37: display section, 38: operation section, 40: management device, 41: control section, 42: CPU, 43: storage section, 44: mounting condition information, 45: offset information, 47: display section, 48: input device, 60: offset value display screen, 61: cursor, 62: offset value display field, 63: confirmation key, C, Ca: clearance, F: offset range, F1: first offset range, F2: second offset range, Fa, Fa1, Fa2: upper limit value, Fb, Fb1, Fb2: lower limit value, H: upper surface height, Hb: reference height, P, Pa: component, S: board, t: thickness

The invention claimed is:

1. A mounting system comprising:

a component supply section configured to supply a component from a holding member on which multiple components are held;

a mounting section configured to mount a pickup member configured to pick up the component from the component supply section;

a measurement section configured to measure an upper surface height of the component held on the holding member;

a lifting and lowering mechanism configured to lift and lower the pickup member by a push-in amount larger than the upper surface height of the component measured by the measurement section; and a control section configured to set an offset value for the lifting and lowering mechanism to adjust a pickup height of the mounting based on the measured height of the component, wherein the control section is configured to cause the measurement section to measure a height of the component on the holding member when a type of the component is a predetermined component type, determine whether the holding member is of a first type or of a second type, when it is determined that the holding member is the first type determine whether the measured height of the component is within a first allowable range, when the measured height of the component is within the first allowable range, set the offset value based on the measured height of the component, and when the measured height of the component is not within the first allowable range, set the offset value within the first allowable range, and when it is determined that the holding member is the second type determine whether the measured height of the component is within a second allowable range, when the measured height of the component is within the second allowable range, set the offset value based on the measured height of the component, and when the measured height of the component is not within the second allowable range, set the offset value within the second allowable range, and wherein the second allowable range is narrower than the first allowable range.

2. The mounting system according to claim 1, wherein the control section is configured to not set the offset value when the offset value is designated.

3. The mounting system according to claim 1, wherein the control section is configured to cause the mounting section to pick up the component from the holding member at the pickup height using the set offset value.

4. The mounting system according to claim 1, wherein the control section is configured to reset the set offset value when a pickup rate falls below a predetermined allowable pickup accuracy in a pickup process of the component performed using the set offset value.

5. A mounting method used in a mounting device including a component supply section configured to supply a component from a holding member on which multiple components are held, a mounting section configured to mount a pickup member configured to pick up the component from the component supply section, and a measurement section configured to measure an upper surface height of the component held on the holding member, the mounting method comprising:

a setting step of setting an offset value for adjusting a pickup height of the mounting section based on a height of the component on the holding member measured by the measurement section when a type of the component is a predetermined component type, the setting step including determining whether the holding member is of a first type or of a second type, when it is determined that the holding member is the first type determining whether the measured height of the component is within a first allowable range, when the measured height of the component is within the first allowable range, setting the offset value based on the measured height of the component, and when the measured height of the component is not within the first allowable range, setting the offset value within the first allowable range, and when it is determined that the holding member is the second type determining whether the measured height of the component is within a second allowable range, when the measured height of the component is within the second allowable range, setting the offset value based on the measured height of the component, and when the measured height of the component is not within the second allowable range, setting the offset value within the second allowable range, wherein the second allowable range is narrower than the first allowable range.

6. The mounting method according to claim 5, further comprising:

a display step of displaying the offset value set in the setting step and the offset value before being set in the setting step.

\* \* \* \* \*